United States Patent
Patzer et al.

(10) Patent No.: US 6,986,114 B2
(45) Date of Patent: Jan. 10, 2006

(54) FEEDBACK CYCLE DETECTION ACROSS NON-SCAN MEMORY ELEMENTS

(75) Inventors: Aaron Thomas Patzer, Princeton, NJ (US); Stephen Douglas Posluszny, Round Rock, TX (US); Steven Leonard Roberts, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 559 days.

(21) Appl. No.: 10/322,088

(22) Filed: Dec. 17, 2002

(65) Prior Publication Data

US 2004/0117697 A1 Jun. 17, 2004

(51) Int. Cl.
 *G01R 31/28* (2006.01)
(52) U.S. Cl. .............................. 716/5; 702/59; 703/15; 703/22; 716/12
(58) Field of Classification Search .................. 702/59; 703/15, 22; 716/5, 12; G01R 31/28
See application file for complete search history.

(56) References Cited

U.S. PATENT DOCUMENTS

| 6,910,193 B1 * | 6/2005 | McBride ........................ 716/4 |
| 2003/0179707 A1 * | 9/2003 | Bare ............................ 370/235 |

FOREIGN PATENT DOCUMENTS

JP 2001358581 A * 12/2001

OTHER PUBLICATIONS

Concurrent Detection of Feedback Loops in Directed Graphs; IBM Technical Disclosure Bulletin, Apr. 1991; vol. 33, No. 1, pp. 338-340.*

* cited by examiner

Primary Examiner—R. Stephen Dildine
(74) Attorney, Agent, or Firm—Carr LLP; Diana R. Gerhardt

(57) ABSTRACT

All feedback cycles in a circuit network which cross only non-scannable memory elements are detected in linear run time. The method models a circuit network as a directed graph, then attributes network elements so that a single feedback cycle may be found in constant time. In the breadth first version, feedback is detected by traversing at most a constant distance back to the last scannable memory element. In the depth first version, graph nodes are not FINISHED until all predecessors are FINISHED. Feedback is found immediately if a node runs into another node that is NOT_FINISHED. This feedback is illegal if both nodes are in a zone defined by the same scannable memory element. The resulting identification and removal of feedback loops crossing only non-scannable memory elements significantly reduces the subsequent complexity of test pattern generation. This ensures a faster, more reliable, and more accurate test process after circuit fabrication.

29 Claims, 11 Drawing Sheets

```
PROCEDURE BFS_Find_Feedback(inputNode)
        Color[inputNode] = BLACK
        Distance[inputNode] = 0
        ENQUEUE(Q, inputNode)
        WHILE Q not empty DO
                DEQUEUE(Q, u)
                # For each child v of node u
                FOR EACH Edge(u, v) DO
                        IF u IS OutputNode THEN
                                # Illegal output boundary if ASSERT is false
                                ASSERT Color[u] == GREEN
                        FI
                        IF Color[v] != NULL THEN              # Previously colored/visited
                                # Node v will not be enqueued; v has already been seen
                                IF Color[u] == RED THEN       # Illegal feedback possible
                                        IF Is_FeedBack(u,v) THEN
                                                # Illegal feedback found, report in some
                                                # useful way
                                                Print "Illegal feedback found!"
                                                # Halt traversal on illegal path
                                                BREAK from WHILE loop
                                        FI
                                ELSE IF (Color[v] == BLACK OR Color[v] == GREEN)
                                        AND Color[u] == RED THEN
                                        # RED dominates a converging path
                                        Distance[v] = Distance[u] + 1
                                        # Check for design violations
                                        ASSERT Distance[v] <= MAX_DIST
                                        Color[v] = RED
                                        Predecessor[v] = u
                                        ENQUEUE(Q, v)
                                ELSE
                                        # Feedback from GREEN or BLACK is permitted
                                FI
                        ELSE                                  # Unvisited node found
                                CASE (v IS ScanLatch):  # Clearing element
                                        Distance[v] = 0
                                        Color[v] = GREEN
                                CASE (v IS NonScanLatch):  # Non-clearing element
                                        Distance[v] = Distance[u] + 1
                                        Color[v] = RED
                                        #Input boundary rule: no BLACK-RED transition
```

*FIG. 5A-1*

```
                    ASSERT Color[u] ! = BLACK
                DEFAULT CASE:
                    Distance[v] = Distance[u] + 1
                    Color[v] = Color[u]    # Inherit color

# Check for design violations
                ASSERT Distance[v] <= MAX_DIST
                Predecessor[v] = u
                ENQUEUE(Q, v)
            FI
        OD
    OD
END Determine if VisitedNode is a predecessor of StartNode
PROCEDURE Is_FeedBack(StarNode, VisitedNode)
    # Iterate over predecessors
    CurrNode = StartNode
    WHILE Distance[CurrNode] > Distance[VisitedNode] DO
        CurrNode = Predecessor[CurrNode]
    OD
    # Distance[CurrNode] == Distance[VisitedNode]
    If CurrNode == VisitedNode THEN
        RETURN FeedbackCycleFound
    FI
    RETURN FeedbackCycleNotFound
END

# Find all illegal NSL feedback lops in linear run-time
PROCEDURE Find_All_Feedback(Graph g)
    # Iterate over all the inputs
    CurrInput = NextInput(g)
    WHILE CurrInput != NULL DO
        BFS_Find_Feedback(CurrInput)
        CurrInput = NextInput(g)
    OD
END
```

*FIG. 5A-2*

```
Global SCAN_LATCH_COUNT = 0

PROCEDURE DFS_Find_Feedback(inputNode)
    Color[inputNode] = BLACK
    Distance[inputNode] = 0
    ZoneID[inputNode] = 0
    PUSH(Stack, inputNode)
    WHILE STACK not empty DO
        Pop(Stack, u)

IF Status[u] == NOT_FINISHED THEN
            Status[u] = FINISHED # Have explored all successors
            NEXT WHILE ITERATION
        ELSE    # Have not explored this node or its successors
            Status[u] = NOT_FINISHED
        FI
        IF u IS OutputNode THEN
            # Illegal output boundary if ASSERT is false
            ASSERT Color[u] == GREEN
        FI

# For each child v of node u
        FOR EACH Edge(u, v) DO
            # Ran into a previously visited node
            IF Status[v] == NOT_FINISHED THEN
                IF ZoneID[u] == ZoneID[v] THEN
                    Print "Illegal feedback found!"
                ELSE  # Different zones so feedback crosses SL
                    # Do nothing, feedback is permitted
                FI
            ELSE IF Status[v] == FINISHED THEN
                # Halt traversal along path
            ELSE                    # Unvisited node found
                CASE (v IS ScanLatch):# Clearing element
                    Distance[v] = 0
                    ZoneID[v] = ++SCAN_LATCH_COUNT
                    Color[v] = GREEN
```

*FIG. 5B-1*

```
            CASE (v IS NonScanLatch): # Non-clearing element
                    Distance[v] = Distance[u] + 1
                    ZoneID[v] = ZoneID[u]
                    Color[v] = RED
                    # Input boundary rule: no BLACK-RED transition
                    ASSERT Color[u] != BLACK DEFAULT CASE:
                    Distance[v] = Distance[u] + 1
                    ZoneID[v] = ZoneID[u]
                    Color[v] = Color[u]      #Inherit color

# Check for design violations
            ASSERT Distance[v] <= MAX_DIST
            Predecessor[v] = u
            Push(Stack, v)
                FI
        END FOR EACH
    END WHILE
END

# Find all illegal NSL feedback loops in linear run-time
PROCEDURE Find_All_Feedback(Graph g)
        # Iterate over all the inputs
        CurrInput = NextInput(g)
        WHILE CurrInput != NULL DO
                DFS_Find_Feedback(CurrInput)
                CurrInput = NextInput(g)
        OD
END
```

*FIG. 5B-2*

FEEDBACK CYCLE DETECTION ACROSS NON-SCAN MEMORY ELEMENTS

FIELD OF THE INVENTION

The present invention relates to the testing of digital circuits and, more particularly, to identifying feedback loops crossing non-scannable memory elements.

SUMMARY OF THE INVENTION

The present invention provides for finding a feedback loop that has no clearing elements. A first node, having a distance count, is employable to record the distance count associated with at least one ancestor node of the first node. There is a loop connecting the first node to a second node. A count analyzer is employable to determine whether the second node, having its own distance count, is the same node as the recorded ancestor of the first node. In one aspect, the loop is flagged as unallowable if the second node is the same node as the ancestor node of the first node.

BACKGROUND

As modern circuit networks shrink in physical dimensions and element counts (transistors, gates, wires) increase exponentially over time, testing a chip for defects after fabrication has become increasingly important and complex. Current state of the art incorporates automated testers which scan computer or hand-generated test cases (known as test vectors) into scan-latches within the circuit network. Generally, scannable memory elements, such as scan-latches, are those elements whose values can be directly observed during a test process. These scannable memory elements are employable to reveal logic values of the circuit blocks under test.

Through employment of known input values, fed into a particular logic function, an output measured by the automated tester can be compared to an expected result. Correspondence of measured results with expected results verifies correct operation of the device.

The physical topology of the circuit network, particularly the arrangement and operation of scannable memory elements, helps to determine the complexity of the test patterns used for verification, the time required for testing each chip, and the quality of those tests in terms of potential faults covered.

Feedback that crosses a particular class of network elements, however, is a physical topology which makes this verification process extremely difficult. Feedback crossing a network element can be generally defined as a feedback loop containing the network element. Feedback across non-scan latches (NSLS)—memory elements whose stored values cannot be directly observed or altered during the test process—pose problems to test pattern generation, test time and test quality.

When a network of logic elements driven by an NSL is fed back to the input of that same NSL, a loop is created that can make testing the circuit networks involved very difficult. Generally, the output value of the NSL at time $t_n$, known as $F(t_n)$, depends on the input $F(t_{n-1})$ because of feedback. $F(t_{n-1})$ in turn depends on $F(t_{n-2})$ in a regression all the way back to the initial state $F(0)$. If this initial state is unknown, testing can be impossible. Even if the initial state is known, however, all values $F(0)$ to $F(t_n)$ (or at a minimum, all the values before some known pattern begins to repeat) should be known by the test pattern generation program in order to determine the next expected output of the circuit network $F(t_{n+1})$. Obtaining and retaining the output values is very costly in terms of compute time and memory, respectively. However, not retaining this information can be even more costly. Not retaining the output values means that the node of logic involved in the loop cannot be tested and, as a result, may have errors that will go unnoticed until use by a customer.

Feedback crossing scannable latches (SLs), however, effectively short-circuits this infinite loop. With SLs, known values can be injected into the circuit network loop at any time and the output can be tested for correspondence to these known inputs. Because it does not pose any special difficulty for test pattern generation, feedback across a scannable element is generally permitted in circuit networks.

A circuit network can be modeled as a directed graph, wherein the nodes or vertices of the graph are the circuit elements (transistors, gates, and so on), while the edges of the graph are the wires, buses or nets of the circuit network. Generally, directed graph is traversed by entering an input pin to the circuit network. A breadth first traversal can be performed from the input. Generally, a breadth first traversal can be defined as visiting and marking all unvisited elements a distance of one from the input, then all unvisited elements a distance of two from the input, and so on. Unvisited elements can generally be defined as a state wherein the element has not yet been visited by the directed graph during a traversal.

However, in the run time of such breadth first traversal algorithms, quadratic $O(N^2)$ time is typically required to find feedback cycles in a directed graph. Here, N equals the number of network elements plus the number of wires or nets connecting those elements. With circuit networks where N is in the range of hundreds of millions to billions of elements, this run time is unacceptably slow. Enormous run time in the case of the $O(N^2)$ breadth first traversal algorithm means that few, if any, of the detrimental feedback cycles crossing non-scan latches will be detected. This in turn makes the circuit network harder to test, diminishes test coverage and increases test time.

As feedback loops cross non-scannable elements, it is desirable to find and eliminate such loops prior to fabrication. Therefore, what is needed is a feedback detector that overcomes the limitations of conventional feedback detectors.

BRIEF DESCRIPTION OF THE DRAWINGS

For a more complete understanding of the present invention, and the advantages thereof, reference is now made to the following Detailed Description taken in conjunction with the accompanying drawings, in which:

FIG. 5A illustrates pseudo-code for a BFS traversal; and

FIG. 5B illustrates pseudo-code for a DFS traversal.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1A:
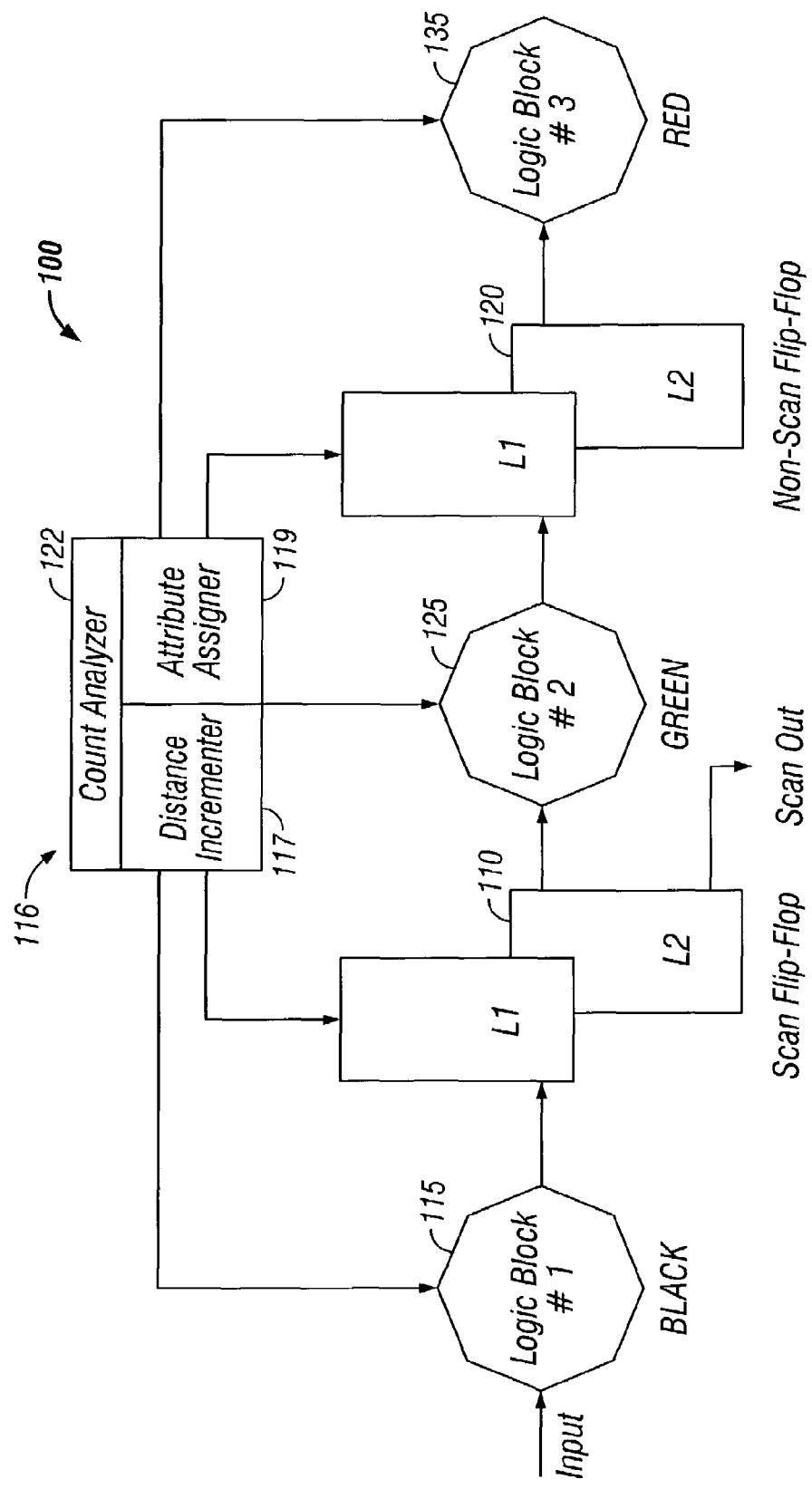
FIG. 1A schematically depicts a directed map comprising scannable and non-scannable elements.

Turning to FIG. 1A, disclosed is a directed map of circuit network 100 comprising scannable, or "clearing," elements 110 and non-scannable, or "non-clearing," elements 120. Generally, the network 100 is tested for non-allowable feedback loops between different logic blocks.

In one embodiment, the scannable and non-scannable elements 110, 120 are pairs of flip-flops. In the network 100, clearing elements, such as scan latches 110, are interposed in electrical paths through the circuit network 100. FIG. 1 further comprises logic blocks 115, 125 and 135. Generally, a node comprises circuit network elements, such as memory elements, logic gates and logic blocks.

The network 100 further comprises a distance incrementer 117, an attribute assignor 119 and a count analyzer 122 within a feedback detector engine 116. Generally, the distance incrementer 117 increments a count associated with a node when traversing from node to node or from node to non-scannable flip-flop. For instance, the count is incremented by one when traversing from node 125 to non-scannable element 120. In one embodiment, the count set by the distance incrementer 117 is reset to zero when encountering a scannable element. For example, when traversing from node 115 to scannable element 110, the count is reset to zero.

In the network 100, feedback lines can cross either clearing elements or non-clearing elements. Turning briefly to FIG. 2A, disclosed is a network 200 with feedback crossing clearing and non-clearing elements. Turning back to FIG. 1, typically, feedback lines are allowed in the circuit network 200 if they cross a clearing element. However, there are design constraints if the feedback loop crosses non-clearing elements. Generally, denoting clearing and non-clearing elements in the circuit network 100 allows for detection of unallowable feedback loops. Generally, feedback loops which cross scan-latches 110 are allowed. Feedback cycles which cross only non-scan latches 120 are not allowed.

In the circuit 100, these clearing elements are placed a maximum distance D from the last clearing element and a maximum distance D from the circuit network input pins. The parameter D is generally defined by design criteria. For example, a maximum of D=30 logic blocks are allowed to be interposed between scan latches. If a feedback loop contains a clearing element, and meets the design criteria, then the feedback loop is allowable. If a feedback loop does not contain the clearing element within the specified parameter D, then the feedback loop is unacceptable.

In FIG. 1A, for each node 115 in the network 100, graph information is stored by an attribute assignor 119.

The network 100 is tested for unacceptable feedback loops through employment of a traversal of the network 100. When traversing the network 100 from input to output, the logic blocks 115 have one of their attributes assigned to them by the attribute assignor 119. In one embodiment, these attributes are color-coded.

TABLE 1

Information for Breadth First Traversal

| Characteristic | Description |
| --- | --- |
| Attribute (Color) | First, Second or Third (RED, GREEN, or BLACK) |
| Distance | The distance away from the last clearing element if the color of this node 115 is GREEN or RED, or the distance away from the input if the color of this node 115 is BLACK. ("DIST"). |
| Predecessor | The unique element from which the directed map first reached this logic block. Also known as the parent element. By definition, a parent element is a distance of 1 away from its children. |

Nodes inherit the color of their predecessor node except for the following initial and special conditions. In one embodiment, the attribute assignor 119 performs the attribute assignment of inheritance. Nodes are assigned a first attribute by the attribute assignor 119 when they are first traversed as an input to the circuit network 100. In one embodiment, the first attribute is the color BLACK. Nodes are assigned a second attribute by the attribute assignor 119, after a path passes through a clearing element 110, such as a scan latch between a parent node and a child logic block. In one embodiment, the second attribute is the color GREEN. Nodes are assigned a third attribute after a traversal crosses a non-clearing element. In one embodiment, the third attribute is the color RED.

The distance characteristic DIST associated with each element is incremented by the distance incrementer 117 with each node 115 or a non-scannable element 120 of the network 100 from a starting point of zero at the input. The increment occurs with each traversal of a node except after passing through a clearing element 110, whereupon the distance is reset to zero by the distance incrementer 117. Hence, the distance characteristic DIST associated with each node 115 measures the distance to the last clearing element 110, if the node 115 color is RED or GREEN. The distance characteristic DIST also measures distance to the input, if the node 115 color is BLACK. If this distance characteristic DIST ever exceeds the predetermined constant value D, set by the architectural design criteria, a design violation occurs.

In FIG. 1A, feedback cycles across logic blocks 115 have design restraints. Again, feedback loops which cross logic element paths having scan latches 110 are allowed, if they meet the other design criteria. Feedback cycles which cross only non-scan latches are not allowed.

In FIG. 1A, logic blocks 115 are previously visited if they have the first, second or third attribute. In traversing a directed graph of the network 100, encountering a first node from a second node can indicate a feedback line, or it can denote the convergence of two paths. The test is then performed by the count analyzer 122.

For instance, if the attribute color associated with an originating, or first logic element, is GREEN, a potential feedback loop, to a potential predecessor second node, is automatically permitted. The count analyzer 122 performs no further testing of this loop and flags it as an allowable connection. This is because feedback originating from a GREEN node would necessarily cross a scannable element 110. Therefore, determining whether the second node is a predecessor of the first node is not necessary and the operation completes in constant time. This type of scannable element 110 is known as a "clearing element" because after passing through it, the DIST characteristic is reset to zero by the distance incrementer 117. A check for feedback within its cleared, or GREEN, zone is not necessary.

However, if the second, or intersected, node has the third, or RED, attribute, an illegal feedback loop could be present. An illegal feedback loop is detected by the count analyzer 122 if the second node that the first node intersects is a predecessor of the current logic block, and if there is no scannable element between the first node and the second node that would make the feedback legal.

In order to determine if an illegal feedback cycle has been found, the count analyzer 122 traverses the list of predecessors of the first, or generating, node back to the distance corresponding to the intersected second node. If the second node is an ancestor of the first node, then an illegal feedback loop has occurred. If the ancestor having the same DIST value is not the second node, an illegal feedback loop has not occurred, and the count analyzer 122 flags an allowable feedback loop. In other words, by the count analyzer 122 enquiring to, at most, the last scannable element 110, but not beyond it, it can be discovered that no scannable element 110 exists between the first node and the second node that would make the feedback allowable. If feedback is not allowable, then the design can be altered to either eliminate the feedback loop or make it allowable by inserting a scannable element.

Following is pseudo-code to ensure that a predecessor logic element 115 contains or does not contain a scannable element.

```
CurrNode = Y
WHILE Distance[CurrNode] > Distance[X] DO
    # Iterate back through predecessor list
    CurrNode = Predecessor[CurrNode]
OD
# Distance[CurrNode] = = Distance[X]
IF CurrNode = = X THEN
    RETURN FeedbackCycleFound
FI
RETURN FeedbackCycleNotFound
```

As is understood by those of skill in the art, OD represents closing the statement that is started with DO, in a similar manner to FI closing a statement starting with IF.

Since the distance characteristic DIST measures the distance away from the last clearing element 110 or the initial input, and this distance can be, at most, a constant distance D away, the above operation takes O(D) constant time. That is, at most, D predecessors will be queried to determine if that predecessor matches the requested DIST value of the intersected node X. Run time depends upon the design criteria which set D at a constant value. For example, there can be no more than D=30 logic gates between scan latches.

When the search for a particular input is complete, the attribute assignor 119 and the distance incrementer 117 are applied to the next input pin to the circuit network, and so on, until all of the inputs to the network are traversed. Distance, color and predecessor characteristics are retained on node 115 elements during this process. That is, nodes 115 that were visited and assigned an attribute during the traversal on one input pin will still remain colored via the previous traversal on the traversal of the next input pin.

Figure 1B:
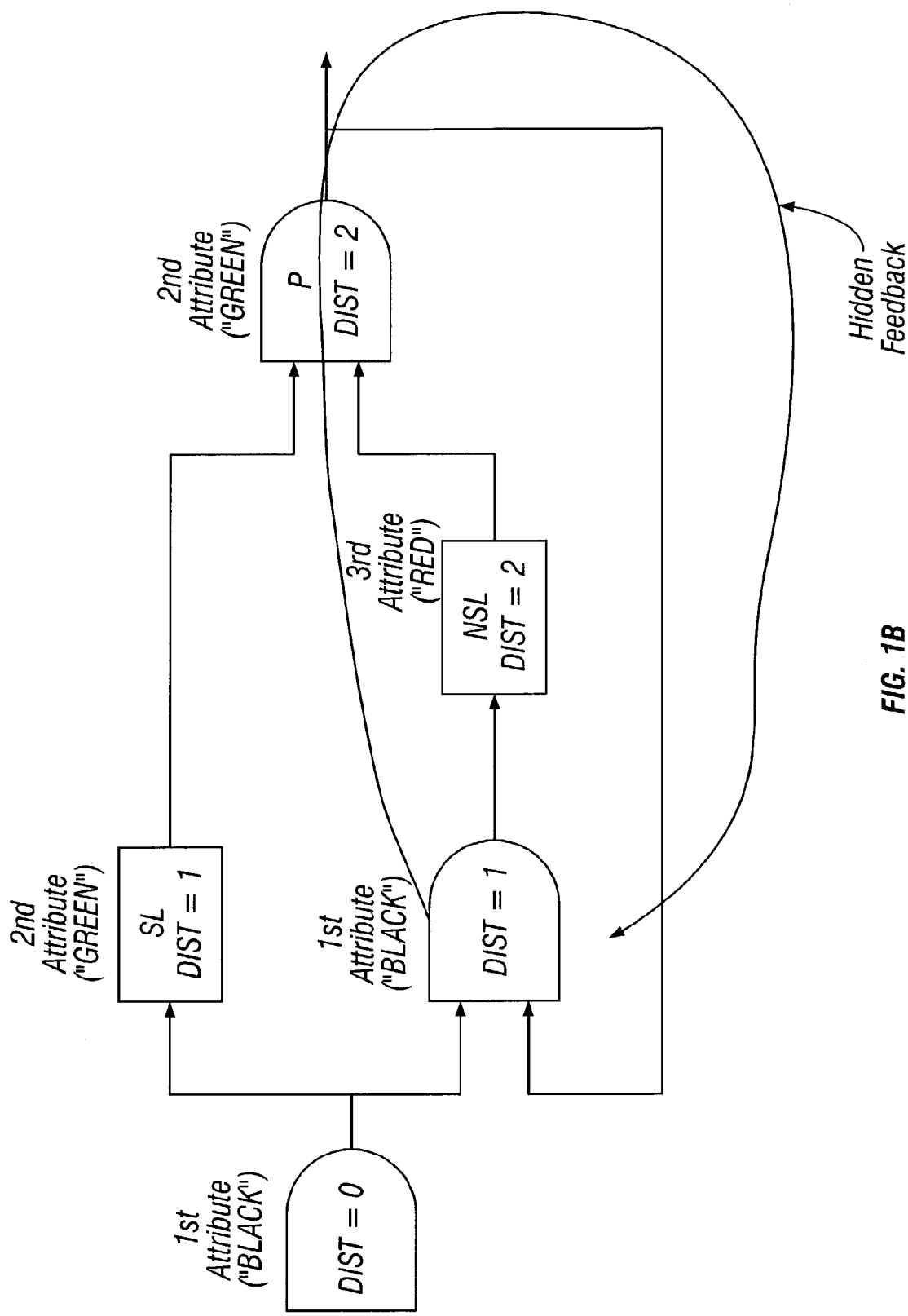
FIG. 1B schematically depicts a directed map comprising a hidden feedback loop.
Figure 2A:
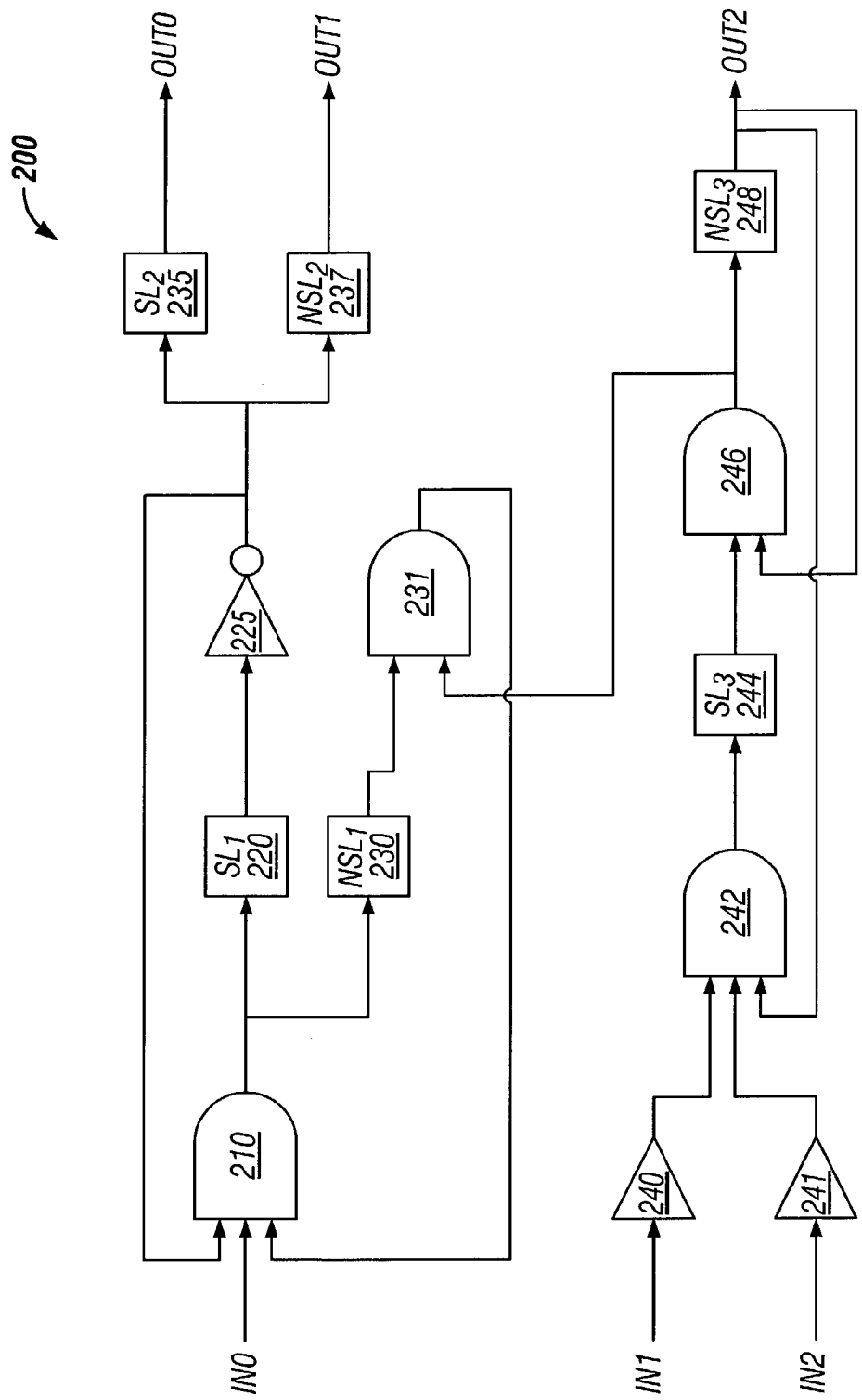
FIG. 2A schematically depicts a circuit network with feedback loops crossing scannable and non-scannable latches.

Turning now to FIG. 1B, disclosed is a hidden feedback loop. In the case of two converging paths of different colors (such as the attributes of GREEN and RED or BLACK and RED), the BFS traversal could proceed in a way that hides feedback crossing an NSL. Typically, this occurs only when a RED path and a non-RED path converge at an element. Whichever path reached the node first will color it and be listed as the predecessor.

In FIG. 1B, DIST=distance as measured by the BFS. The top path reaches node P at DIST=2 and colors it GREEN. Since node P is GREEN, the algorithm does not check output leading to the BLACK node at distance 1 as a potential feedback. Therefore, the BFS determines there is no unallowable feedback loop from P with respect to the top path. However, there could be an unallowable feedback loop with respect to another path leading to node P if that other path is RED. When the bottom path reaches node P, RED dominates the converging paths and is propagated through. This allows for the detection of any illegal feedback from nodes P and beyond leading back to the bottom path.

Since the RED path dominates GREEN and BLACK, each path in the network is traversed, at most, twice; once when coloring GREEN or BLACK, and then potentially a second time if RED dominates a converging path. Hence, the overall run time 2*n=O(n) stays linear.

Turning again to FIG. 2A, illustrated is a circuit network 200 with feedback loops crossing scannable and non-scannable latches. The network 200 comprises inputs IN0, IN1 and IN2. The IN0 is input into AND gate 210. The output of AND gate 210 is input into a scannable latch (SL1) 220 and a non-scannable latch (NSL1) 230. The NSL output is then fed into a 2-way AND gate 231. The output of the 2-way AND gate is fed into an input of the AND gate 210, thereby creating a feedback loop. The output of the scannable latch 220 is inverted by the inverter 225. The output of the inverter 225 is input into a scan latch 235 and a non-scannable latch 237. The output of scan latch 235 and the non-scannable latch 237 are OUT0 and OUT1, respectively. The output of inverter 225 is also fed into an input of the 3-way AND gate 210, thereby creating another feedback loop.

IN1 and IN2 are input into two signal buffers 240 and 241, respectively. The buffers are then fed into a 3-way AND gate 242. The output of the AND gate 242 is fed into a scannable latch 244. The output of the scannable latch 244 is fed into a 2-way AND gate 246. The output of AND gate 246 is fed into the 2-way input AND gate 231, and also fed into NSL3 248. The output of NSL 248 is input into the 3-way AND gate 242, thereby creating a feedback loop. Furthermore, the output of NSL 248 is input into the AND gate 246, thereby creating another feedback loop. Finally, the output of NSL 248 is also fed to OUT2.

Figure 2B:
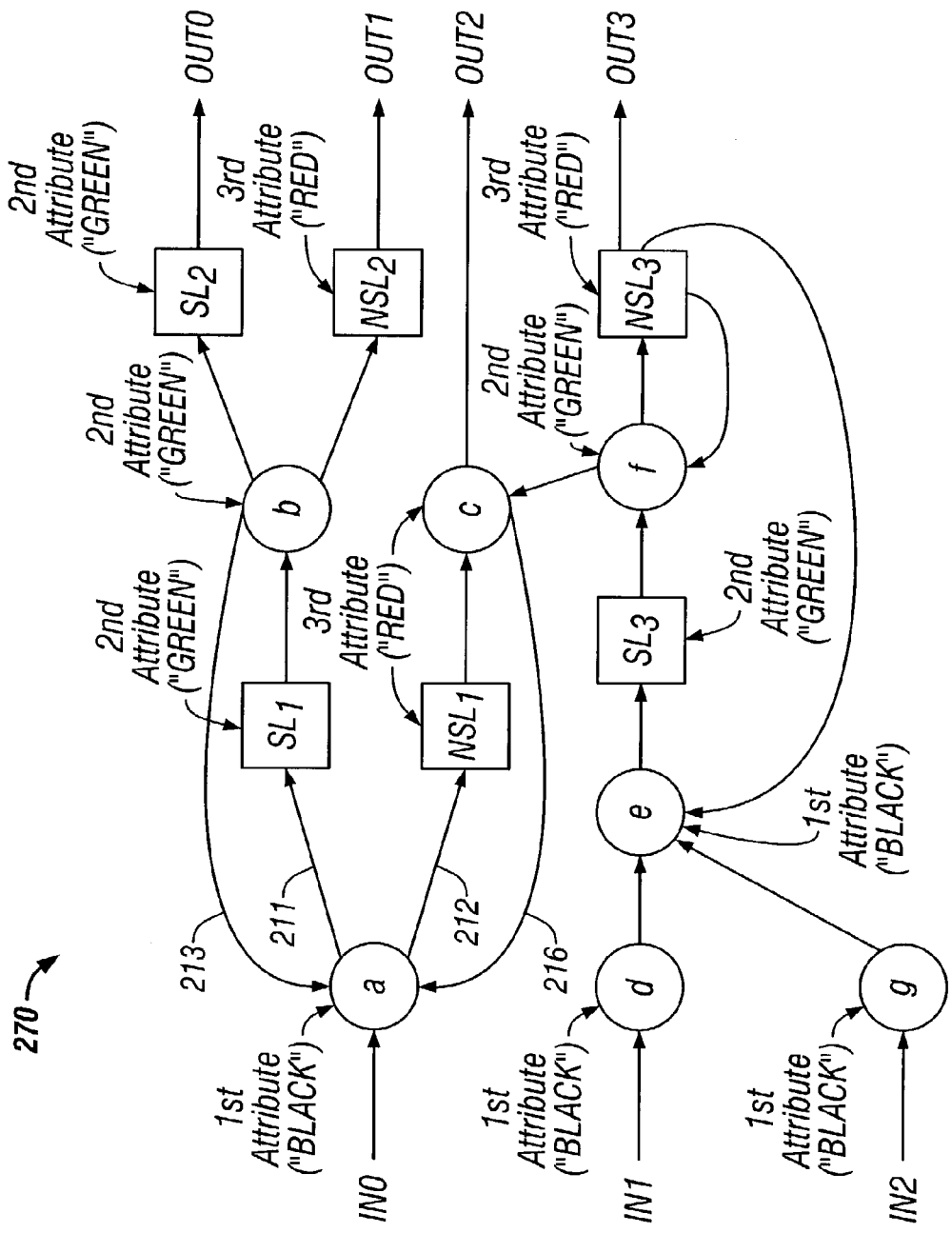
FIG. 2B schematically depicts the circuit network expressed as a directed graph.

Turning now to FIG. 2B, illustrated is the network 200 of FIG. 2A expressed as a directed graph 270. For purposes of illustration, the various nodes of the directed graph 270 have been expressed as a first, second and third attribute, such as RED, GREEN and BLACK, but those of skill in the art understand that other coloring schemes are within the scope of the present invention.

When testing for feedback loops that violate design parameters, the directed graph 270 is characterized. Starting at IN0, the node "a," corresponding to a node 115, is colored "BLACK," as it has not intersected an SL or non-SL latch. The DIST count at node "a" is 1. Then, each path 211 and 212 is traversed in the next round of the BFS, which looks at elements a distance of two away from IN0, and memory elements, such as latches, are encountered. SL (220) is scannable, so it is colored GREEN. Furthermore, the distance variable is set back to zero. However, path 212 encounters a non-scannable latch NSL (230), so a color transition is made from BLACK to RED, and the Distance variable is incremented and stored in the non-scannable latch. SL 220 is then traversed to node "b" which is GREEN due to the GREENness of its immediate predecessor, and the Distance variable for this node is incremented to "1." NSL 230 is then traversed into node "c." Node "c" is RED due to the REDness of its immediate predecessor, and its associated Distance is incremented to "2."

The output of node "b" is then in a feedback loop to node "a." Because the color of NSL3 is RED, a check is performed to determine whether a scannable element exists between the NSL3 and the nodes "e" and "f" which are found to have already been visited. It is determined that "f" having DIST count 1, is the ancestor of NL3 having DIST count 1. Therefore, the feedback loop to node "f" is not allowable. It is determined that "e" having DIST count 2 is not the ancestor of NSL3 having DIST count 2. For this reason, there is a scannable element between NSL3 and node "e." Indeed, SL3 is between NSL3 and node "e," so the feedback is allowable. Furthermore, in FIG. 2B, the distance is within the allowable design constraint D, so the second design feature is met. Therefore, feedback loop 213 is allowable.

In FIG. 2B, because node "a" already has an associated attribute, node "c" checks to see whether an ancestor node that has the same distance count, before the last scannable element, is the same as the intersected node. In the illustrated embodiment of FIG. 2B, node "a" is the same node as the predecessor node having the same distance count, so the feedback is illegal.

Starting from input IN1 and IN2, the input nodes "d" and "g" are both BLACK. They are, in turn, traversed into node "e," which also inherits the color attribute, in this case BLACK, from its immediate predecessor. The output of BLACK is then fed into SL3 (244), which resets the count to zero and changes the inheritable attribute to the second attribute, GREEN. This second, or GREEN, attribute is inherited by node "f." The output of node "f" is input into node "c" and NSL3.

Because node "f," the originating node, has the second attribute, any feedback that occurs between node "f" and node "c" is an allowable feedback. However, node "f" is also input into NSL3, thereby changing the color from GREEN to RED from this element and after. The output of RED is then fed into the node "e."

Because the color input into node "e" is RED, a check is performed to determine whether a scannable element exists between the NSL3 and the node "e." It is then determined whether or not a node "e," having its associated distance count, is the same node as the ancestor node of NSL 244. These two nodes are not the same, so this is a legal loop.

In a further embodiment, it is determined whether the total number of logic elements between scannable elements exceeds D. This is typically performed as part of the same traversal as determining for an illegal feedback loop. In one embodiment, this is performed by determining if the DIST value for the tested node is greater than the D allowable value.

In a further embodiment, combinational logic feedback loops are discovered. Combinational logic loops are detrimental to chip testing for similar reasons that non-scan latch feedback loops are. A combinatorial logic loop can be generally defined as a logic loop where the loop does not involve any memory elements. Typically, combinational logic loops create infinite loops whose values cannot be directly observed or altered by the test equipment.

In one embodiment, to find combinational logic loops, the predecessor list is examined up to the value of DIST of the intersected node, regardless of the color of the source node. If the source node identifies the intersection node as a predecessor, then this loop is either a combinational logic loop or an illegal NSL feedback loop. Either way, the feedback loop is identified and reported for correction. The testing for a single combinatorial logic loop is O(D) constant time. The run time of this new method to find all such loops is $O(D*N)=O(N)$, where D is a constant value independent of N, where N is equal to the number vertices (nodes) plus the number of edges (arcs) in a directed graph representation of the circuit network. Equivalently, this is the number of circuit elements plus the number of interconnections between those elements.

Figure 3A:
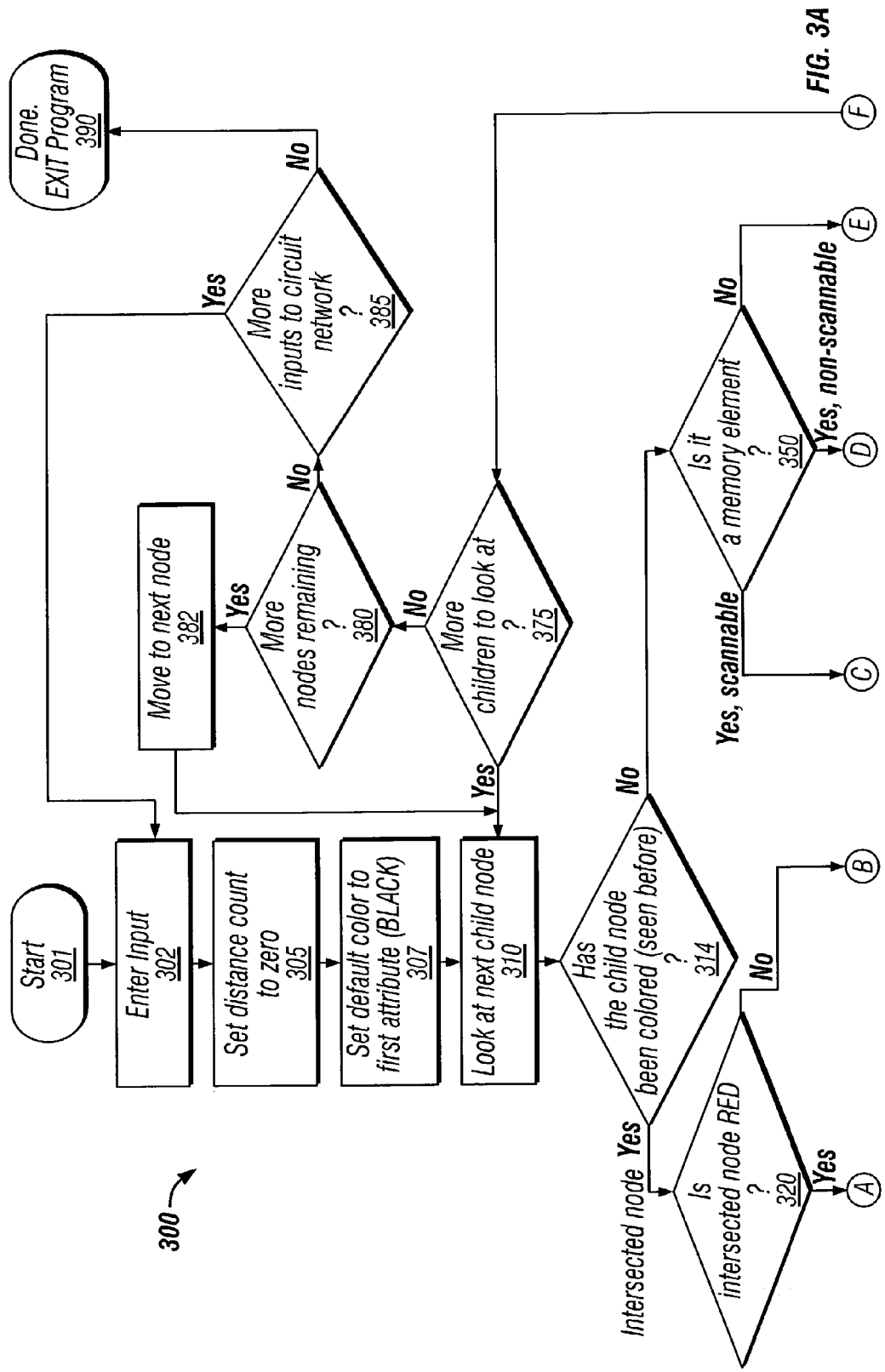
FIGS. 3A and 3B illustrate a method for checking for illegal feedback loops.
Figure 3B:
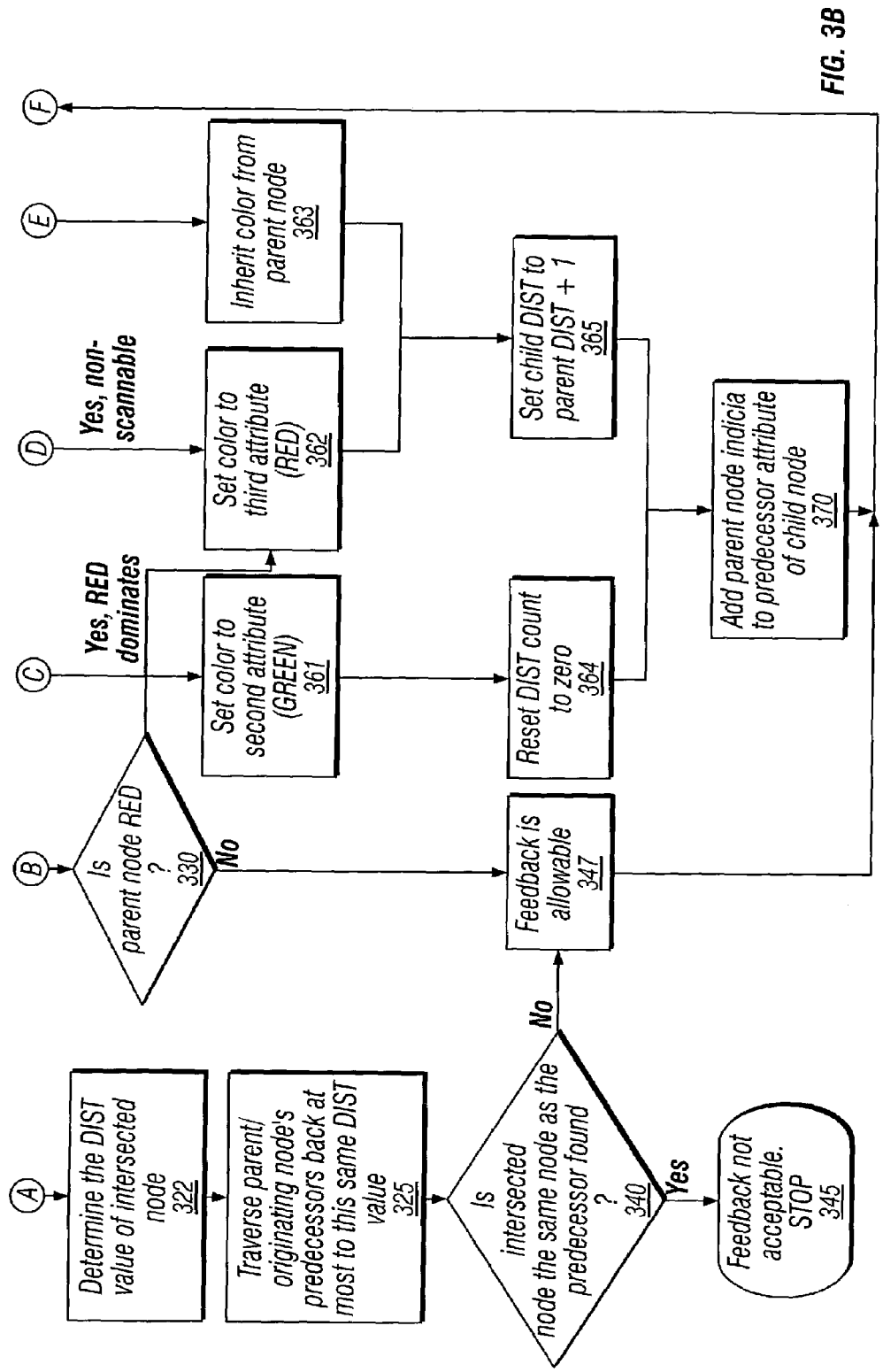

Turning now to FIGS. 3A and 3B, illustrated is a method 300 for checking for illegal feedback loops in a circuit network using a BFS algorithm. In step 301, the method starts. In step 302, an input of the circuit network is entered. In step 305, distance count (DIST) is set to zero. Generally, distance count at a node is the path length from that node back to the last scannable element. In step 307, a default attribute is set to the third attribute. In one embodiment, the third attribute comprises the color BLACK.

In step 310, there is an increment from either an input or a parent node to a child node. In other words, the next child node for the BFS traversal is examined. In step 314, the method 300 determines whether the child node has been visited before. In one embodiment, this is performed through determining whether the child node has a first, second or third attribute assigned to it. In other words, if the child node has any of the RED, GREEN or BLACK colors assigned to it.

If the child node has been visited before, in step 320, the method 300 determines whether the intersected node is RED. If the intersected node is RED, then the DIST value of the intersected node is determined in step 322. Then, in step 325, the parent/originating node predecessors are traversed to the same DIST as the intersected node in step 330. In step 340, the method 300 determines whether the intersected node is the same node as the node having the same DIST value in the predecessor list. If it is, then the feedback is unacceptable, and the method stops in step 345. However, if the two nodes are not the same, the feedback is determined to be allowable in step 347.

However, if the intersected node is determined not to be RED in step 320, the method 300 determines if the parent node is RED in step 330. If the parent node is not RED, then step 347 executes, and feedback is allowable. However, if the parent node is RED, then step 362 executes, and the color of the intersected node is set to the third attribute (RED).

If step 314 determines that the child node does not have an attribute of RED, GREEN or BLACK associated with it, that child node has not been visited before, and step 350 executes. Step 350 determines whether the child node is a memory element and, if so, whether it is a scannable memory element. If the child node is a scannable memory element, then the second attribute (GREEN) is set for the child node, in step 361. Then, the DIST count is reset to zero in step 364. If the child node is a non-scannable memory element, then the third attribute (RED) is set for the child node, in step 362. If the child node of step 350 is not a memory element, the child node inherits its color from the parent node, in step 363. In either case of step 362 or step 363, the child DIST is set to equal the parent DIST+1 in step 365. In either the case of step 364 or step 365, in step 370, the parent node indicia (that is, the first second or third attribute) is stored in the predecessor attribute of the child node, such as a pointer to the parent node in the child node's predecessor attribute. Typically, one such value is stored per node.

After either step 347 or step 370 executes, the method 300 then determines whether a parent node has any other child nodes to look at, in step 375. If there are more child nodes to look at, step 310 re-executes, and the next child node is looked at. If not, in step 380, the method 300 determines if there are any more nodes left to test. If there are more nodes to test for illegal feedback, then in step 382, the BFS moves to the next node. Determination of the next node is implementation specific. In general, each node stores a list of pointers to its children. Once done iterating through this list of children, the next node can be obtained by popping the top element off a queue, and step 310 re-executes. If there are no nodes to be tested, then in step 385, it is determined whether there are any more inputs to the circuit network. If there are more inputs, then the new input is entered again in step 302, and the flow re-executes. If not, then in step 390, the method indicates that it is done, and exits the program.

In a further embodiment, a depth first traversal is performed from an input to the circuit network. Depth first searches (DFS) go to the end of a given path before returning to go to the end of the next path. The attributes of the DFS are as follows.

TABLE 2

DEPTH FIRST EMBODIMENT

| Characteristic | Description |
| --- | --- |
| Attribute (Color) | First, Second or Third (RED, GREEN, or BLACK) |
| Distance | The distance away from the last clearing element if the color of this node 115 is GREEN or RED, or the distance away from the input if the color of this node 115 is BLACK. |
| Predecessor | The unique element from which the directed map first reached this logic block. Also known as the parent element. By definition, a parent element is a distance of 1 away from its children The unique ID assigned to the last scannable latch encountered on the path leading to this node. |
| Status | NULL/NOT_VISITED, NOT_FINISHED, FINISHED. |
| ZONE_ID | The unique element from which the directed map first reached this logic block. Also known as the parent element. By definition, a parent element is a distance of 1 away from its children. |

The distance, predecessor and color attributes of the BFS of Table 1 substantially correspond to the DFS of Table 2.

However, DFS have two additional characteristics. These are the "status" attribute and the "ZONE_ID" attribute.

Before being encountered in an attribute-assigning traversal, each node has the status of NULL/NOT VISITED. When first visited, a node is designated as NOT_FINISHED. A node is not marked FINISHED until all of its children nodes have completed their depth first traversals.

The ZONE_ID is a unique ID assigned to the last scannable latch seen on the path leading to a logic block. After passing through a scannable latch (SL), the logic blocks on the subsequent paths are inside the given zone until the paths pass through a different SL.

If during traversal a first node runs into a second node that already has an attribute associated therewith, it can be determined if the second node is a predecessor through reading the status of the second node. If the status of the second node equals NOT_FINISHED, then the second node is a predecessor and feedback has been found. To determine whether this is an illegal or permissible feedback loop, the ZONE_ID of the first and second nodes are compared. If the ZONE_ID of the second node is equal to the ZONE_ID for the first node, then a feedback loop which does not cross any scannable element has been found. Therefore, this feedback is not allowed (that is, it is illegal).

If the ZONE_ID for the second node is not equal to the ZONE_ID of the first node, there is a scannable element between the first and second node, and feedback is allowed. This follows from the definition of the ZONE_ID. This definition is that nodes along all paths originating from a scannable element inherit that scannable element's ZONE_ID. This continues until those paths pass through a different scannable element wherein the nodes will obtain a different ZONE_ID.

DFS and BFS are two fundamental and widely used ways to traverse graphs. By providing methods for detecting feedback crossing only NSLs using both traversals, the invention can more easily be integrated into existing microelectronics design tools and methodologies.

Whether DFS or BFS is used is implementation specific and may depend on some knowledge of the circuit network. For example, a circuit network with wide fan out relative to its depth would require a large BFS queue and a relatively small DFS stack. Conversely, a circuit network with low fan out and long relative depth would require a larger DFS stack than a BFS queue. This can be important if system memory is a limiting bottleneck.

Figure 4:
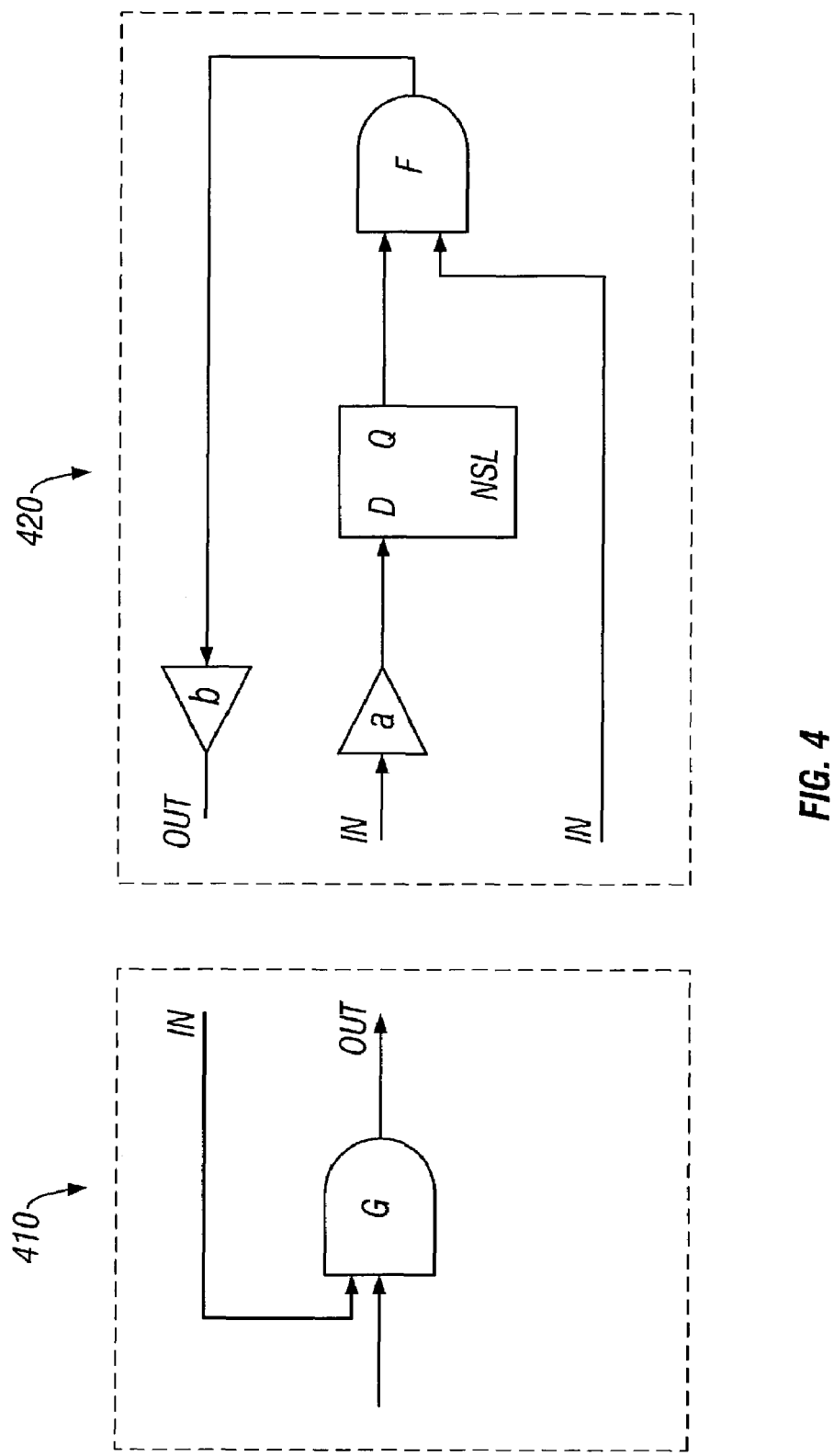
FIG. 4 schematically depicts two coupled networks.

Turning now to FIG. 4, illustrated are two networks 410 and 420. Large integrated circuit designs, including system-on-a-chip designs, can consist of many interconnected modules, or networks. In FIG. 4, the networks 410 and 420, each free of illegal NSL feedback loops, form an illegal NSL feedback loop when connected.

To avoid such problems, in a further embodiment, when networks 410 and 420 are verified to be free of detrimental feedback loops across NSLs, the resulting aggregate circuit network is also verified to be free of boundary violations. This can be enforced through the following boundary rules.

1) A scannable element is reached on any input path before a non-scannable element is reached. This is the "input" rule. 2) A scannable element is the last latch seen on an output path. This is the "output" rule. In other words, a non-scannable element cannot be seen last (that is, after a scannable element). 3) Finally, a latch is to be seen at some point on the path before being output. The is the "latch" rule.

If both the input and output rules are employed in the design of the plurality of networks 410 and 420, a feedback loop will not cross only an NSL when networks 410 and 420 are connected. Generally, if either the input or output rules are applied, along with the latch rule, there cannot be any NSLs between the output of a first module and its connection to the input of a second module, and hence no illegal feedback loops are possible.

In this further embodiment, at least some of the boundary latches, such as 235, 237 and 248 are scannable between every large functional unit, such as networks 200 are scannable. This means that at least the first latch traversed along any input path, such as latches 220, 230, and 244, are scannable. In a further embodiment, the last latch seen on any output, such as latches 235, 237 and 248, are scannable. In a still further embodiment, scan latches may be placed as both the first input and last output latches. This configuration allows control over the inputs of the network 200 and observation of all outputs to match with the expected results. Any one of these three boundary scan embodiments, if employed within a plurality of aggregated networks 200, will ensure that no feedback loops crossing only NSLs can exist between network 200. FIG. 3 indicates how this could happen. If only the output rule is applied, this again is sufficient to guarantee no feedback loops crossing only NSLs can occur when networks 410 and 420 are connected, provided the latch rule is applied.

To enforce the boundary rules, it is necessary to ensure that, for the input rule, there is no color transition from the first attribute to the third attribute, for example, from BLACK to RED. Such a transition indicates that a non-clearing element was seen before a clearing element on an input path, which is not allowed under the input rule. To enforce the output rule, the attribute color of the last node (the node connected to the output pin) is not RED, the third attribute. If the attribute color is RED, then the last latch seen on the output path was not scannable. For the latch rule to be enforced, the color of the last node must be GREEN or RED. This ensures that the input to output path has a latch on it.

Those of skill in the art understand, however, that discovering illegal feedback loops can apply to communication networks, power networks, computer networks, control networks, and so on. In other words, the present invention can be applied to networks having feedback present within.

Turning now to FIGS. 5A and 5B, disclosed are source and pseudo-code for a BFS and DFS implementation, respectively, of the methods described in this invention. Input and output boundary checking is performed. Design criteria validation is also performed. This ensures that the distance between non-scan latches never exceeds the predetermined value D=MAX_DIST.

In FIG. 5A, the procedure Find_All_Feedback( ) is called on the directed graph representation of the circuit network. From there, a breadth first search (BFS) traverses the graph looking for feedback loops. All feedback loops crossing only non-scan latches are found in linear O(N) time. N=|V|+|E|, the number of nodes plus the number of edges or, equivalently, the number of circuit elements plus the number of interconnects/wires between them. In a further embodiment of FIG. 5B, a depth search (DFS) traverses the graph looking for feedback loops.

It is understood that the present invention can take many forms and embodiments. Accordingly, several variations may be made in the foregoing without departing from the spirit or the scope of the invention. For example, different communications standards may be implemented, and the like.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

What is claimed is:

1. A system for finding feedback loops which cross only non-clearing elements, comprising:
   a first node, the second node employable to record a distance count of at least one ancestor node;
   a second node, the second node having a distance count;
   a connection connecting the first node to the second node; and
   a count analyzer, employable to determine whether the second node, having its own distance count, is the same node as the recorded ancestor node, having the same distance count, of the first node.

2. The system of claim 1, further comprising a scannable element, coupled to the first node.

3. The system of claim 1, further comprising a plurality of nodes between the first node and the second node, each node having a separate distance count.

4. The system of claim 3, wherein the associated count associated with the nodes between the second node and the first node is incremented from node to node.

5. The system of claim 1, wherein the count analyzer is employable to flag the loop as unallowable if the first node is the same as the ancestor node.

6. The feedback loop of claim 1, further comprising a scannable element inserted between the first logical node and the second logical node.

7. The system of claim 6, wherein the scannable element is a latch.

8. The system of claim 5, wherein the scannable element is employable to reset the distance count to zero.

9. The system of claim 1, wherein the feedback loop is in a power network, a telecommunications network or a bus interconnect.

10. A method of generating indicia of feedback conditions in a network, comprising:
    determining whether there is a memory element between a parent logical node and a child logical node;
    if there is a memory element, assigning a second attribute to the child logical node if the memory element is a scannable memory element;
    if there is a memory element, assigning a third attribute to the child logical node if the memory element is a non-scannable memory element;
    storing a distance of one plus the parent distance in the child node; and
    storing the indicia of the parent node in the child node.

11. The method of claim 10, further comprising assigning a first attribute to a first logic element from an input, the first attribute indicating that no memory element has been encountered in the traversal.

12. The method of claim 10, further comprising resetting the associated count of elements to zero upon the interposition of a scannable memory element between the parent logical node and the child node.

13. The method of claim 10, further comprising inheriting the attribute by the child node from the parent node if there is no memory element interposed between the child node and the parent node.

14. A method of determining an illegal feedback loop, comprising:
   selecting a first node;
   selecting a second node, the second node having a first, second or third attribute;
   creating a connection from the first node to the second node; and
   if the second node has the second attribute, flagging the connection as an allowable connection.

15. The method of claim 14, wherein the step of selecting a node having a second attribute indicates that at least one memory element is encountered in the traversal from first node to second node.

16. The method of claim 14, wherein the step of selecting a node having a third attribute indicates that a non-scannable memory element was the last memory element encountered in the traversal first node to second node.

17. The method of claim 14, wherein the allowable connection comprises an allowable feedback loop.

18. The method of claim 14, further comprising:
   if the second node has the third attribute:
      retrieving the distance count value at the second node;
      retrieving indicia of an ancestor node of the first node having the same count value as the second node;
      flagging the loop as an allowable loop if the second node and the ancestor node having the same count are not the same node; and
      flagging the feedback loop as an unallowable feedback loop if the second node and the ancestor node having the same count are the same node.

19. The method of claim 14, further comprising flagging a design violation if there are more than a predetermined number of logical nodes and non-scannable elements between two clearing elements.

20. A method for determining that a plurality of aggregated circuit networks have allowable feedback loops, comprising:
   determining whether a first network has unallowable feedback loops within the first network;
   determining whether a second network has unallowable feedback loops within the second network; and
   requiring at least one scannable memory element placed within the first and second networks between each input and output of each network.

21. The method of claim 20, further comprising the placement of a scannable element on an input path before a placement of non-scannable element within both the first and second network.

22. The method of claim 20, further comprising the placement of a scannable element as the last memory element before an output within both the first and second network.

23. The method of 20, wherein the scan memory rule comprises both a requirement that a scannable element is interposed on an input path before a non-scannable element, and a requirement that a scannable latch is the last memory element before an output of both the first and second networks.

24. A method of finding an illegal feedback loop using a depth first search, comprising:
   determining whether there is a memory element between an ancestor logical node and a child logical node;
   if there is a memory element, assigning a first attribute to the child logical node if the memory element is a scannable memory element;
   if there is a memory element, assigning a second attribute to the child logical node if the memory element is a non-scannable memory element;
   incrementing the associated count of the child node;
   generating a status of NOT_FINISHED or FINISHED for a child logical node;
   generating an incremental scan count indicia for the last scannable element encountered on path from parent node; and
   inheriting the incremental scan count by descendant logical nodes.

25. A method of determining an illegal feedback loop, comprising:
   selecting a first node;
   selecting a second node;
   creating a connection from the first node to the second node;
   if the second node does not have a first, second or third attribute, flagging the connection as an allowable connection;
   if the second node has a first, second or third attribute:
      if the second node has a finished status, flagging the connection is an allowable connection;
      if the second node has a non-finished status, determining if the first node and the second node have the same incremental ZONE_ID;
      if the first and second nodes both have the same incremental scan count, flagging the connection as an unallowable connection; and
      if the first and second nodes have different incremental scan counts, flagging the connection as an allowable connection.

26. A computer program product for generating indicia of feedback conditions in a network, the computer program product having a medium with a computer program embodied thereon, the computer program comprising:
   computer code for determining whether there is a memory element between a parent logical node and a child logical node;
   if there is a memory element, computer code for assigning a first attribute to the child logical node if the memory element is a scannable memory element;
   if there is a memory element, computer code for assigning a second attribute to the child logical node if the memory element is a non-scannable memory element;
   computer code for incrementing the associated count of the child node; and
   computer code for storing the associated count of the parent node and indicia of the parent node in the child node.

27. A processor for generating indicia of feedback conditions in a network, the processor including a computer program comprising:
   computer code for determining whether there is a memory element between a parent logical node and a child logical node;
   if there is a memory element, computer code for assigning a first attribute to the child logical node if the memory element is a scannable memory element;
   if there is a memory element, computer code for assigning a second attribute to the child logical node if the memory element is a non-scannable memory element;

computer code for incrementing the associated count of the child node; and computer code for storing the associated count of the parent node and indicia of the parent node in the child node.

28. A computer program product for determining an illegal feedback loop, the computer program product having a medium with a computer program embodied thereon, the computer program comprising:

computer code for selecting a first node;

computer code for selecting a second node, the second node having a first, second or third attribute;

computer code for creating a connection from the first node to the second node; and if the second node has the second attribute, computer code for flagging the connection as an allowable connection.

29. A processor for determining an illegal feedback loop, the processor including a computer program comprising:

computer code for selecting a first node;

computer code for selecting a second node, the second node having a first, second or third attribute;

computer code for creating a connection from the first node to the second node; and if the second node has the second attribute, computer code for flagging the connection as an allowable connection.

\* \* \* \* \*